(12) United States Patent
Udagawa

(10) Patent No.: US 7,989,926 B2
(45) Date of Patent: Aug. 2, 2011

(54) SEMICONDUCTOR DEVICE INCLUDING NON-STOICHIOMETRIC SILICON CARBIDE LAYER AND METHOD OF FABRICATION THEREOF

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 474 days.

(21) Appl. No.: 12/067,407

(22) PCT Filed: Sep. 12, 2006

(86) PCT No.: PCT/JP2006/318455
§ 371 (c)(1),
(2), (4) Date: Jun. 25, 2008

(87) PCT Pub. No.: WO2007/034761
PCT Pub. Date: Mar. 29, 2007

(65) Prior Publication Data
US 2009/0267081 A1  Oct. 29, 2009

Related U.S. Application Data

(60) Provisional application No. 60/720,651, filed on Sep. 27, 2005.

(30) Foreign Application Priority Data

Sep. 20, 2005 (JP) ................................. 2005-271396

(51) Int. Cl.
*H01L 29/20* (2006.01)

(52) U.S. Cl. ......... 257/615; 257/E21.097; 257/E21.119; 257/E21.127; 257/E21.054; 257/E21.514; 257/E29.104; 257/E31.023; 257/E31.046; 257/E33.035; 438/933

(58) Field of Classification Search .................. 257/615, 257/E21.097, E21.119, E21.127, E21.054, 257/E21.541, E21.605, E29.104, E31.023, 257/E31.046, E31.049, E33.035; 438/933
See application file for complete search history.

(56) References Cited

U.S. PATENT DOCUMENTS 5,130,269 A  7/1992 Kitahara et al.
(Continued)

FOREIGN PATENT DOCUMENTS

JP  55-3834  1/1980
(Continued)

OTHER PUBLICATIONS

M. Asif Khan, et al.; "Metal semiconductor field effect transistor based on single crystal GaN"; Appl. Phys. Lett. 62 (15); Apr. 12, 1993; pp. 1786-1787.
(Continued)

*Primary Examiner* — Benjamin P Sandvik
*Assistant Examiner* — Farid Khan
(74) *Attorney, Agent, or Firm* — Sughrue Mion, PLLC

(57) ABSTRACT

A semiconductor device includes a substrate formed of a single crystal. a silicon carbide layer disposed on a surface of the single crystal substrate and an intermediate layer disposed on a surface of the silicon carbide layer and formed of a Group III nitride semiconductor, wherein the silicon carbide layer is formed of a cubic crystal stoichiometrically containing silicon copiously and the surface thereof has a (3×3) reconstruction structure. The semiconductor device is fabricated by a method including a first step of blowing a hydrocarbon gas on the surface of the substrate, thereby inducing adsorption of hydrocarbon thereon, a second step of heating the substrate having adsorbed the hydrocarbon to a temperature exceeding a temperature used for the adsorption of the hydrocarbon while irradiating the surface of the substrate with electrons and consequently giving rise to a silicon carbide layer formed of a cubic crystal stoichiometrically containing silicon copiously and provided with a surface having a (3×3) reconstruction structure and a third step of supplying a gaseous raw material containing nitrogen and a gaseous raw material containing a Group III element to the surface of the silicon carbide layer and consequently giving rise to the intermediate layer formed of the Group III nitride semiconductor.

11 Claims, 2 Drawing Sheets

U.S. PATENT DOCUMENTS

| | | |
|---|---|---|
| 5,300,186 A | 4/1994 | Kitahara et al. |
| 5,484,664 A | 1/1996 | Kitahara et al. |
| 6,270,573 B1 * | 8/2001 | Kitabatake et al. ............ 117/95 |
| 7,012,016 B2 * | 3/2006 | Gwo ............................ 438/602 |
| 2002/0026892 A1 | 3/2002 | Aoyagi et al. |

FOREIGN PATENT DOCUMENTS

| | | | |
|---|---|---|---|
| JP | 02-191318 A | | 7/1990 |
| JP | 04-223330 | * | 8/1992 |
| JP | 04-223330 A | | 8/1992 |
| JP | 6-151963 | | 5/1994 |
| JP | 6-151966 | | 5/1994 |
| JP | 6-326416 | | 11/1994 |
| JP | 08-056015 | * | 2/1996 |
| JP | 08-056015 A | | 2/1996 |
| JP | 2002-025349 A | | 1/2002 |
| JP | 2002-075879 A | | 3/2002 |

OTHER PUBLICATIONS

T. Kikuchi, et al.; "3C-SiC/Si template growth and atomic layer epitaxy of cubic GaN by RF-MBE"; Journal of Crystal Growth 275 (2005) e1215-e1221.

"Advanced Silicon Carbide Ceramics-Recent Development-"; Japan Society for the Promotion of Science; High Temperature Ceramic Material; 124th Committee; Uchida Rokakuho Publishing Co., Ltd.; Feb. 28, 2001; Chapter 1.2.1. Partial Translation.

"Advanced Silicon Carbide Ceramics-Recent Development-"; Japan Society for the Promotion of Science; High Temperature Ceramic Material; 124th Committee; Uchida Rokakuho Publishing Co., Ltd.; Feb. 28, 2001; Table 5.1.1 Partial Translation.

* cited by examiner

SEMICONDUCTOR DEVICE INCLUDING NON-STOICHIOMETRIC SILICON CARBIDE LAYER AND METHOD OF FABRICATION THEREOF

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/720,651 filed Sep. 27, 2005 and Japanese Patent Application No. 2005-271396 filed Sep. 20, 2005 pursuant to 35 U.S.C. §111 (b).

TECHNICAL FIELD

This invention relates to a semiconductor device provided with a substrate formed of a single crystal, a silicon carbide layer disposed on the surface of the single crystal substrate and an intermediate layer disposed on the surface of the silicon carbide layer and formed of a Group III nitride semiconductor and to a method for the fabrication of the semiconductor device.

BACKGROUND ART

Group III-V compounds, such as gallium nitride (GaN) and aluminum nitride (AlN), have been heretofore known as Group III nitride semiconductors. These Group III nitride semiconductor materials are utilized for configuring semiconductor light-emitting devices, such as light-emitting diodes (LEDs) and laser diodes (LDs), which emit a visible light of short wavelength in a blue color or a green color (refer, for example, to JP-B SHO 55-3834). They are also utilized for configuring electronic devices, such as Schottky junction Metal Semiconductor Field-Effect Transistors (MESFETs), that operate at a high frequency (refer, for example, to M. A. Khan et al., Applied Physics Letters (U.S.A.), 1993, Vol. 62, p. 1786).

The semiconductor devices formed of these Group III nitride semiconductor materials are configured by using a sapphire ($\alpha$-$Al_2O_3$) bulk single crystal (refer, for example, to JP-A HEI 6-151963) or a cubic silicon carbide (SiC) bulk single crystal as the substrate (refer, for example, to JP-A HEI 6-326416). For example, the production of a short-wavelength visible LED by utilizing a stacked structure provided on a sapphire substrate with a clad layer formed of a Group III nitride semiconductor material and a light-emitting layer has become feasible (refer, for example, to JP-A HEI 6-151966).

The sapphire ordinarily used as the substrate for a Group III nitride semiconductor device, however, does not exhibit a fully satisfactory matching property on the crystal lattice with a Group III nitride semiconductor material, such as GaN. Thus, the use of sapphire as the substrate entails a problem that the Group III nitride semiconductor layer revealing crystalline defects, such as dislocation, only insignificantly and excelling in crystallinity is not stably obtained. When the silicon carbide bulk single crystal excelling in thermal conductivity is used as the substrate, it is convenient for the configuration of an LED excelling in the property of breakdown voltage relative to static electricity and a MESFET excelling in the property of radiating heat. The silicon carbide bulk single crystal that possesses a large aperture proper for the crystal to be utilized for the substrate, however, is expensive and proves to be disadvantageous in producing a general-purpose Group III nitride semiconductor device at a low price.

The silicon single crystal (silicon) essentially excels in thermal conductivity and has already reached the stage of allowing mass production of a single crystal of large diameter and good conductivity. When the silicon of large size and good conductivity is utilized as the substrate, therefore, it is expected to enable practical use of an inexpensive conventional LED which gives a high breakdown voltage relative to static electricity. When the silicon abounding in thermal conductivity in spite of high resistance is utilized as the substrate, it is expected to realize the MESFET fit for low-loss high-frequency telecommunication. Since the silicon single crystal has a lattice constant "a" of 0.543 nm, however, it produces a large lattice mismatch with a Group III nitride semiconductor, e.g. hexagonal GaN (a-axis lattice constant=0.319 nm). The mismatch of the silicon is still large with cubic GaN (a=0.451 nm). The silicon substrate, therefore, has been at a disadvantage in rendering difficult stable formation of a Group III nitride semiconductor layer exhibiting superior quality and revealing crystalline defects only insignificantly.

For the purpose of overcoming this disadvantage, the means of inserting during the formation of the Group III nitride semiconductor layer on the single crystal substrate having a large lattice mismatch a buffer layer intended to relax the mismatch of lattices of these two components has been generally followed heretofore. In the case of forming the Group III nitride semiconductor layer on the silicon substrate, the conventional technique of forming the Group III nitride semiconductor layer via a thin film layer of a cubic 3C-type silicon carbide (3C-SiC) has been known (refer, for example, to T. Kikuchi et al., Journal of Crystal Growth (Holland), 2005, Vol. 275, Nos. 1-2, pp. e12150-e1221). Since the quality of the 3C-SiC thin film layer conspicuously varies the crystallinity, for example, of the Group III nitride semiconductor layer formed thereon, this technique is at a disadvantage in failing to form stably the Group III nitride semiconductor layer of superior quality. Even when using a buffer layer of SiC, a Group III nitride semiconductor layer having been formed thereon cannot always have its surface excellent in flatness. This is problematic.

Single crystals excelling in electrical conductivity and in heat radiating heat and possessing a large diameter have been already in mass production. For the purpose of obtaining a semiconductor device using silicon as the substrate and excelling in optical and electrical properties, it is necessary that a buffer layer be so formed as to relax the lattice mismatch with the silicon substrate and bring about a Group III nitride semiconductor layer of superior quality. Even when the cubic SiC layer is used as the buffer layer in the case of forming the Group III nitride semiconductor layer on the silicon substrate, the SiC buffer layer is required to be so formed as to relax favorably the lattice mismatch between the two materials and allow formation as an upper layer of the Group III nitride semiconductor layer containing crystalline defects with a low density, excelling in crystallinity, and also excelling in flatness of the surface.

This invention has been produced with a view to overcoming the aforementioned problems encountered by the prior art and is aimed at providing a semiconductor device capable of using a SiC buffer layer on a single crystal substrate, forming thereon a Group III nitride semiconductor layer containing crystalline defects with a low density and excelling in crystallinity, and enhancing the light-emitting property and the high-frequency performance and a method for the production of the semiconductor device.

DISCLOSURE OF THE INVENTION

For the purpose of accomplishing the object mentioned above, the first aspect of the invention provides a semiconductor device comprising a substrate formed of a single crystal, a silicon carbide layer disposed on a surface of the single crystal substrate and an intermediate layer disposed on a surface of the silicon carbide layer and formed of a Group III nitride semiconductor, wherein the silicon carbide layer is formed of a cubic crystal stoichiometrically containing silicon copiously and the surface thereof has a (3×3) reconstruction structure.

The second aspect of the invention provides the semiconductor device set forth in the first aspect, wherein the substrate is formed of a silicon single crystal.

The third aspect of the invention provides the semiconductor device set forth in the first or second aspect, wherein the substrate is formed of a {111} silicon single crystal possessing a {111} crystal face as the surface thereof.

The fourth aspect of the invention provides the semiconductor device set forth in the third aspect, wherein the surface of the substrate has a (7×7) reconstruction structure.

The fifth aspect of the invention provides the semiconductor device set forth in any one of the first to forth aspect, wherein the intermediate layer contains aluminum as a Group III element.

The sixth aspect of the invention provides the semiconductor device set forth in the fifth aspect, wherein the intermediate layer is formed of hexagonal wurtzite crystal aluminum-gallium nitride ($Al_xGa_{1-x}N$ wherein $0 \leq X \leq 1$).

The seventh aspect of the invention provides the semiconductor device set forth in any one of first to sixth aspects, wherein the intermediate layer has a Group III nitride semiconductor layer disposed thereon.

The eighth aspect of the invention provides a method for producing a semiconductor device that includes a substrate formed of a single crystal, a silicon carbide layer disposed on a surface of the single crystal substrate and an intermediate layer disposed on a surface of the silicon carbide layer and formed of a Group III nitride semiconductor, comprising a first step of blowing a hydrocarbon gas on the surface of the substrate, thereby inducing adsorption of hydrocarbon thereon, a second step of heating the substrate having adsorbed the hydrocarbon to a temperature exceeding a temperature used for the adsorption of the hydrocarbon while irradiating the surface of the substrate with electrons and consequently giving rise to a silicon carbide layer formed of a cubic crystal stoichiometrically containing silicon copiously and provided with a surface having a (3×3) reconstruction structure, and a third step of supplying a gaseous raw material containing nitrogen and a gaseous raw material containing a Group III element to the surface of the silicon carbide layer and consequently giving rise to the intermediate layer formed of the Group III nitride semiconductor.

The ninth aspect of the invention provides the method set forth in the eighth aspect, wherein the intermediate layer is formed in the third step by supplying the gaseous raw material containing the Group III element temporally prior to the gaseous raw material containing nitrogen.

The tenth aspect of the invention provides the method set forth in the eighth aspect, wherein the intermediate layer formed of a Group III nitrogen semiconductor layer containing aluminum is formed in the third step by supplying a gaseous raw material containing aluminum temporally first, then supplying the gaseous raw material containing the Group III element other than aluminum, and subsequently supplying the gaseous raw material containing nitrogen.

The eleventh aspect of the invention provides the method set forth in any one of the eighth to tenth aspects, wherein the adsorption of hydrocarbon to the surface of the substrate in the first step is implemented by blowing the hydrocarbon gas on the surface of the substrate and irradiating the surface with electrons meanwhile.

Since this invention, in the semiconductor device comprising a substrate formed of a single crystal, a silicon carbide layer disposed on the surface of the single crystal substrate, and an intermediate layer disposed on the surface of the silicon carbide layer and formed of a Group III nitride semiconductor, contemplates having the silicon carbide layer formed of a cubic crystal stoichiometrically containing silicon copiously and having the surface thereof possess a (3×3) reconstruction structure, it is enabled to form on the silicon carbide layer an intermediate layer formed of a Group III nitride semiconductor containing crystalline defects with a low density and excelling in crystallinity and to utilize the intermediate layer of superior quality for enhancing the light-emitting property and the high-frequency performance of the semiconductor device.

Since this invention contemplates forming the substrate of a {111} silicon single crystal having a {111} crystal face as the surface thereof and stacking thereon a silicon carbide layer and an intermediate layer formed of a Group III nitride semiconductor, it is enabled to realize the intermediate layer containing twin boundaries with a low density and excelling particularly in crystallinity.

Since this invention contemplates forming the surface of the substrate in the (7×7) reconstruction structure, it is enabled to form thereon the cubic silicon carbide layer possessing a (3×3) reconstruction structure efficiently and stably.

Since this invention contemplates including aluminum as a Group III element in the Group III nitride semiconductor forming the intermediate layer, it is enabled as coupled with the action manifested by the silicon carbide layer in relaxing the lattice mismatch between the substrate and the Group III nitride semiconductor to form the intermediate layer composed of the Group III nitride semiconductor containing crystalline defects with a low density and excelling in crystallinity and consequently enhance the effect of utilizing the intermediate layer of superior quality in producing semiconductor devices, such as LED, which excel in optical and electrical performances.

Since this invention contemplates forming the Group III nitride semiconductor constituting the intermediate layer particularly of a hexagonal wurtzite crystal aluminum-gallium nitride ($Al_xGa_{1-x}N$: $0 \leq X \leq 1$) layer, it is enabled to form on the silicon carbide the intermediate layer containing twin boundaries with a low density and excelling in crystallinity.

Since this invention contemplates disposing the Group III nitride semiconductor layer on the intermediate layer, it is enabled to utilize the Group III nitride semiconductor layer of superior quality for providing a compound semiconductor light-emitting device displaying high luminance and excelling in electrical performances, such as reverse voltage in the reverse direction. When the hexagonal Group III nitride semiconductor layer is utilized as an electron transporting layer (channel layer), it enables configuration of a Schottky junction field effect transistor (FET), which realizes a high electron mobility and allows production of the FET excelling in high-frequency performance.

In a method for producing a semiconductor device that includes a substrate formed of a single crystal, a silicon carbide layer disposed on the surface of the single crystal substrate, and an intermediate layer disposed on the surface of the silicon carbide layer and formed of a Group III nitride semiconductor, this invention contemplates implementing the production by a procedure which comprises a first step of blowing a hydrocarbon gas on the surface of the substrate, thereby inducing adsorption of hydrocarbon thereon, a second step of heating the substrate having adsorbed the hydrocarbon to a temperature exceeding a temperature used for the adsorption of the hydrocarbon while irradiating the surface of the substrate with electrons and consequently giving rise to a silicon carbide layer formed of a cubic crystal stoichiometrically containing silicon copiously and provided with a surface having a (3×3) reconstruction structure, and a third step of supplying a gaseous raw material containing nitrogen and a gaseous raw material containing a group III element to the surface of the silicon carbide layer and consequently giving rise to the intermediate layer formed of the Group III nitride semiconductor. Therefore, it is enabled to form conveniently and stably the cubic silicon carbide layer possessing the surface of a (3×3) reconstruction structure, form on the silicon carbide layer the intermediate layer composed of the Group III nitride semiconductor containing crystalline defects with a low density and excelling in crystallinity, and consequently utilize the intermediate layer of superior quality for enhancing the light-emitting property and the high-frequency performance of a semiconductor device.

Since this invention, while forming the intermediate layer in the third step, contemplates producing the intermediate layer by supplying the gaseous raw material containing a Group III element temporally prior to supplying the gaseous raw material containing nitrogen, it is enabled to manifest the effect of forming the intermediate layer composed of the Group III nitride semiconductor excelling in crystallinity without inducing extinction of the (3×3) reconstruction structure formed on the surface of the silicon carbide layer.

Since this invention, while forming the intermediate layer in the third step, contemplates producing the intermediate layer formed of the Group III nitride semiconductor layer containing aluminum by supplying the gaseous raw material containing aluminum first temporally, then supplying the gaseous raw material containing a Group III element other than aluminum, and subsequently supplying the gaseous raw material containing nitrogen, it is enabled to produce the intermediate layer formed of the Group III nitride semiconductor containing aluminum and excelling in crystallinity without inducing extinction of the (3×3) reconstruction structure formed on the surface of the silicon carbide layer.

Since this invention, during the course of the first step, contemplates blowing hydrocarbon gas on the surface of the substrate while irradiating the surface with electrons, thereby inducing adsorption of hydrocarbon to the surface of the substrate, it is enabled to effect uniform adsorption of hydrocarbon throughout the entire surface of the single crystal substrate and consequently contribute to uniform formation, on the surface of the single crystal substrate, of the silicon carbide layer stoichiometrically containing silicon copiously and possessing a homogeneous (3×3) reconstruction structure.

The above and other objects, characteristic features and advantages of the present invention will become apparent to those skilled in the art from the description to be given herein below with reference to the accompanying drawings.

BEST MODE FOR CARRYING OUT THE INVENTION

Figure 1:
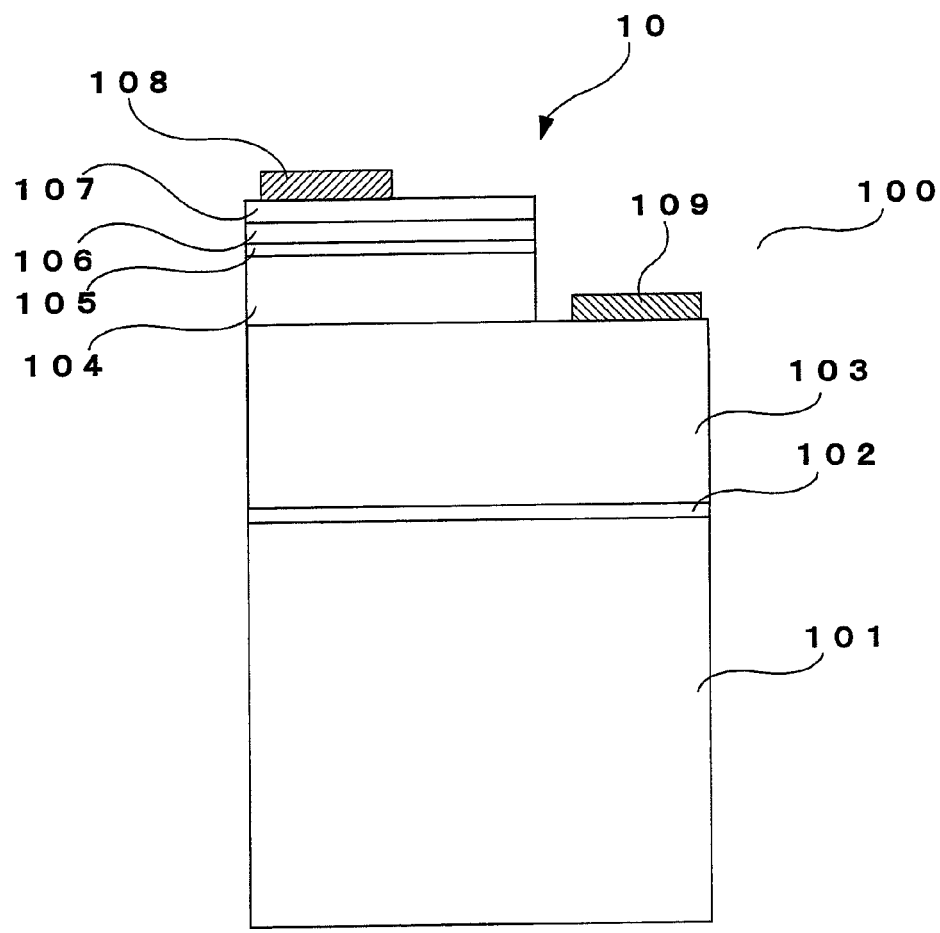
FIG. 1 is a schematic, longitudinally sectioned view illustrating the LED described in Example 1 of this invention.

This invention, in the semiconductor device comprising a substrate formed of a single crystal, a silicon carbide layer disposed on the surface of the single crystal layer and an intermediate layer disposed on the surface of the silicon carbide layer and formed of a Group III nitride semiconductor, contemplates having the silicon carbide layer formed of a cubic crystal stoichiometrically containing silicon copiously and having the surface thereof possess a (3×3) reconsideration structure.

As the substrate to be used for the purpose of forming the silicon carbide layer stoichiometrically containing silicon copiously and possessing a surface of the (3×3) reconstruction structure according to this invention, the {111} silicon single crystal having a {111} crystal face as the surface thereof proves to be favorable. The silicon having as the surface thereof a crystal face inclined by an angle of several degrees from the {111} crystal face can be satisfactorily utilized as the substrate. The conduction type of the silicon to be used as the substrate is irrelevant. No matter whether the silicon has a conduction type of either p-type or n-type, it can be utilized as the substrate. Particularly, the silicon exhibiting high conductivity and low resistivity (specific resistance) can be utilized as a favorable substrate for fabricating semiconductor devices, such as LED and LD. Then, the silicon exhibiting high resistance can be favorably utilized as the substrate for fabricating electronic devices, such as MESFET, that are required to decrease the leakage toward the substrate of the electric current used for operating the device (device-operating current).

The silicon carbide layer stoichiometrically containing silicon copiously and possessing a surface of the (3×3) reconstruction structure is preferably a cubic crystal layer possessing a 3C-type crystal structure ("Recent Development of SiC-based Ceramic New Materials," compiled and written by the 124th Committee of Academic Promotion Society of Japan, published on Feb. 28, 2001 by Uchida Rokakuho Publishing Co., Ltd., first edition, pp. 13-16). The 3C-type silicon carbide (3C-SiC) layer is formed, for example, by utilizing the hydrocarbon atoms adsorbed to the surface of the silicon substrate. As concrete examples of the hydrocarbon molecules to be adsorbed for the purpose of forming the 3C-SiC layer, saturated aliphatic hydrocarbon molecules, such as methane ($CH_3$), ethane ($C_2H_6$) and propane ($C_3H_8$), and unsaturated hydrocarbon molecules, such as acetylene ($C_2H_2$), may be cited. Though the molecules of aromatic hydrocarbons and alicyclic hydrocarbons are also available, the acetylene that decomposes and reacts readily with silicon (Si) can be utilized most favorably.

The temperature at which the {111} crystal face constituting the surface of the {111} silicon is made to adsorb acetylene molecules is preferably selected in the range of 400° C. to 600° C. By heating the silicon substrate after the crystal face constituting the surface of the silicon substrate has adsorbed the hydrocarbon, the hydrocarbon so adsorbed is allowed to react with the silicon (Si) atoms constituting the silicon substrate crystal and consequently give rise to a 3C-SiC layer. When the silicon substrate is heated at a temperature in the range of 500° C. to 700° C. in this case, this heating proves to be convenient for forming the 3C-SiC layer that stoichiometrically contains silicon copiously. The time required for forming the 3C-SiC layer stoichiometrically containing silicon copiously is decreased in accordance as the temperature for heating the silicon substrate having adsorbed the hydrocarbon is increased.

In the 3C-SiC layer having a nonstoichiometric composition, the degree with which silicon (Si) is contained copiously in comparison with carbon (C) is reflected in the lattice constant of the 3C-SiC layer. In the 3C-SiC having a nonstoichiometric composition, the lattice constant is increased in accordance as the silicon content in the composition increases. While the 3C-SiC having a stoichiometric composition has a lattice constant of 0.436 nm (refer, for example, to the aforementioned "Recent Development of SiC-based Ceramic New Materials," page 340, Table 5.1.1.), this invention uses the 3C-SiC layer that has a lattice constant exceeding 0.436 nm and falling on 0.450 nm, for example. The confirmation of the fact that the SiC layer to be used is a 3C-type crystal and the confirmation of the lattice constant thereof can be accomplished by utilizing electron diffraction analysis, for example.

The 3C-SiC layer possessing a nonstoichiometric composition containing silicon copiously as mentioned above and possessing a (3×3) reconstruction structure in the surface as well can be conveniently formed by a method that comprises creating a reconstruction structure of silicon atoms on the surface of a silicon substrate and subsequently causing the surface to adsorb the molecules of hydrocarbon, such as acetylene. The 3C-SiC layer possessing a (3×3) reconstruction structure can be conveniently formed, for example, by causing the surface formed of a {111} crystal face of a {111} silicon substrate to generate a (7×7) reconstruction structure and subsequently enabling it to adsorb the hydrocarbon molecules.

The (7×7) reconstruction structure of silicon can be formed by subjecting the {111} crystal face constituting the surface of the {111} silicon substrate to a heat treatment performed at a temperature in the range of 750° C. to 850° C. in a Molecular Beam Epitaxial (MBE) growth chamber in an environment of high vacuum that is approximately $10^{-6}$ Pa. The appearance of the (7×7) reconstruction structure of silicon can be confirmed by means of electron diffraction analysis, such as Reflection High Energy Electron Diffraction (RHEED).

When hydrocarbon molecules are blown onto the surface of the silicon substrate while the surface is being irradiated with electrons during the formation of the silicon carbide layer on the surface of the silicon substrate, the surface of the silicon substrate is enabled to adsorb the hydrocarbon uniformly. As the electrons for the irradiation, the thermal electrons emitted from a metal electrically heated in a vacuum are utilized. For the purpose of enabling the surface of a single crystal substrate to adsorb hydrocarbon molecules uniformly, the electrons are preferably made to irradiate the surface of the substrate at an equal density. The electrons preferably irradiate the surface of the single crystal substrate at a lower angle than the angle used for blowing hydrocarbon molecules onto the surface. The incidence of the electrons at this low angle is intended to activate hydrocarbon molecules so as to be readily captured by the atoms constituting the single crystal existing in the region approximating closely to the surface of the single crystal substrate, prevent the electrons from advancing deeply from the surface of the single crystal substrate to the interior thereof as well, and suppress the occurrence of crystalline defects in the deep part of the single crystal substrate. While the hydrocarbon molecules are blown onto the surface of the single crystal substrate approximately from the perpendicular direction, for example, the electrons are made to irradiate the surface at a lower angle, i.e. from the direction of 30° in terms of the angle of elevation based on the surface of the substrate.

The density of irradiation of electrons is proper in the range of $1 \times 10^{12}$ to $5 \times 10^{13}$ cm$^{-2}$. If the acceleration energy of the electrons to be radiated falls short of about 100 eV, the shortage will be at a disadvantage in preventing the surface of the single crystal substrate from adsorbing the hydrocarbon molecules uniformly. If the electrons having an acceleration energy exceeding 500 eV are used for the irradiation, the excess will be at a disadvantage in rather promoting decomposition and desorption of the hydrocarbon molecules and preventing the surface of the substrate from adsorbing hydrocarbon molecules uniformly. Thus, the electron generating source, such as the bias voltage difference between a tungsten (W) filament and the single crystal substrate which is the subject of irradiation is preferred to be 100 V or more and 500 V or less.

In the case of heating the silicon substrate having adsorbed hydrocarbon on the surface thereof and consequently forming the 3C-SiC layer on the surface of the substrate, the radiation of electrons toward the surface of the substrate enables the 3C-SiC layer possessing a (3×3) reconstruction structure to be stably formed. This result may be explained by supposing that the electrons used for the irradiation impart an energy advantageous for inducing the reconstruction structure to the silicon atoms constituting the surface of the silicon substrate. The density of irradiation of electrons is proper in the range of $1 \times 10^{12}$ to $5 \times 10^{13}$ cm$^{-2}$. The acceleration energy of the electrons for the irradiation is proper in the range of 100 eV to 500 eV. By the radiation of electrons under such suitable conditions, the 3C-SiC layer that contains crystalline defects, such as twin crystals and stacking faults, only at a small density and excels in crystallinity can be formed.

On the surface that possesses the (3×3) reconstruction structure in the 3C-SiC layer having a nonstoichiometric composition, there is disposed the intermediate layer formed of a Group III nitride semiconductor. An example of this Group III nitride semiconductor is $Al_XGa_YIn_ZN_{1-\alpha}M_\alpha$ (in which $0 \leq X, Y, Z \leq 1$, $X+Y+Z=1$, symbol M denotes a Group V element other than nitrogen (N) and $0 \leq \alpha < 1$ is satisfied). The $Al_XGa_YIn_ZN_{1-\alpha}M_\alpha$ that constitutes the intermediate layer can be composed of aluminum-gallium nitride ($Al_XGa_YN$ wherein $0 \leq X, Y \leq 1$ and $X+Y=1$), gallium-indium nitride ($Ga_YIn_ZN$ wherein $0 \leq Y, Z \leq 1$, $Z \leq 1$ and $Y+Z=1$) and aluminum-nitride phosphide ($AlN_{1-\alpha}P_\alpha$ wherein $0 \leq \alpha < 1$), for example.

Particularly, the intermediate layer is preferably composed of a Group III nitride semiconductor material that has a small degree of lattice mismatch with the 3C-SiC layer. On the 3C-SiC layer of a nonstoichiometric composition having a lattice constant 0.451 nm, for example, a layer composed of a cubic zinc blende crystal GaN (lattice constant=0.451 nm) is preferably disposed as bonded. Then, on the 3C-SiC layer of a nonstoichiometric composition having a lattice constant 0.438 nm, for example, a layer composed of a cubic zinc blende crystal AlN (lattice constant=0.438 nm) is preferably disposed as bonded.

It is convenient to dispose as the intermediate layer a layer composed of a wurtzite crystal hexagonal Group III nitride semiconductor possessing an a-axis lattice constant conforming to the spacing between (110) crystal faces of the 3C-SiC layer of a nonstoichiometric composition. On the 3C-SiC layer of a nonstoichiometric composition having the spacing between the (110) crystal faces in the range of 0.308 nm to 0.325 nm, for example, hexagonal wurtzite crystal AlN (a=0.311 nm) and GaN (a=0.319 nm) each possessing an a-axis lattice constant in that range can be favorably disposed as bonded.

The lattice constant of the 3C-SiC layer of a nonstoichiometric composition is varied also by the temperature used during the adsorption of hydrocarbon molecules to the surface of the single crystal substrate for the purpose of forming that layer. As the temperature used during the adsorption of hydrocarbon molecules is heightened, the 3C-SiC layer is enabled to contain silicon (Si) in a proportionately increased amount and the 3C-SiC layer is enabled to acquire a proportionately increased lattice constant. In the case of heating the single crystal substrate after the single crystal substrate has adsorbed hydrocarbon molecules, by implementing the heating while supplying the substrate with a gas containing silicon (Si), it is made possible to form the 3C-SiC layer that contains silicon (Si) copiously. It is the 3C-SiC layer of a nonstoichiometric composition possessing a lattice constant larger than 0.436 nm and 0.460 nm or less and containing Si copiously that can be favorably used for producing an intermediate layer formed of a cubic or hexagonal Group III nitride semiconductor.

In the case of forming the intermediate layer composed of a Group III nitride semiconductor on the 3C-SiC layer of a nonstoichiometric composition, the procedure of supplying the raw material of a Group III element prior to supplying the raw material of a Group V element constituting the intermediate layer enables efficient formation of the intermediate layer having a uniquely arranged orientation. In the case of forming a hexagonal GaN layer as an intermediate layer on the surface formed of a {111} crystal face of the 3C-SiC layer possessing a (3×3) reconstruction structure, for example, by supplying the raw material of gallium (Ga) temporally prior to supplying the raw material of nitrogen, it is made possible to form the Group III nitride semiconductor layer that has a unique relation of orientation of <110>-3C-SiC∥ a-axis-GaN. The symbol "∥" used herein means that both crystal faces are parallel mutually.

In the case of providing the 3C-SiC layer of a nonstoichiometric composition with an intermediate layer formed of a Group III nitride semiconductor material containing aluminum (Al), the formation of the intermediate layer is preferably implemented by starting supply of the raw material of aluminum (Al) first temporally, then supplying the raw material of the Group III element other than Al, and subsequently supplying the raw material of a Group V element, such as nitrogen. By supplying the raw material of Al temporally first, it is made possible to form the intermediate layer that has the crystal system and the relation of orientation as well unified uniquely.

The intermediate layer formed of the Group III nitrogen semiconductor can be formed by utilizing growth means, such as Metal Organic Chemical Vapor Deposition (MOCVD) method, halogen or hydride Chemical Vapor Deposition (CVD) method, MBE method or Chemical Beam Epitaxial (CBE) method. In such growth means, when the steps of (a) cleaning the surface of a silicon substrate and revealing a (7×7) reconstruction structure, (b) causing the cleaned surface of the silicon substrate to adsorb hydrocarbon molecules, (c) forming a 3C-SiC layer by utilizing the adsorbed hydrocarbon molecules and (d) forming an intermediate layer on the 3C-SiC layer are implemented in the order mentioned throughout by the same means, this procedure proves to be advantageous for easy fabrication of the semiconductor device.

In accordance with means of effecting the growth in an environment of high vacuum, such as MBE method or CBE method, the process of inducing a (7×7) reconstruction structure on the surface formed of a (111) crystal face of a (111) silicon substrate, causing the surface of the silicon substrate to adsorb hydrocarbon molecules while allowing an environment of high vacuum convenient for the retention of the reconstruction structure to remain intact, forming a 3C-SiC layer by utilizing the adsorbed hydrocarbon molecules and thereafter forming an intermediate layer composed of a Group III nitride semiconductor on the surface of the 3C-SiC layer possessing a (3×3) reconstruction structure can be continuously implemented to allow easy fabrication of a semiconductor device.

When the means of attaining the growth by utilizing the environment of high vacuum is employed, the irradiation of the surface of the silicon substrate with electrons can be readily effected while the surface of the silicon substrate is in the process of adsorbing hydrocarbon molecules. Further, in the case of forming the 3C-SiC layer possessing the (3×3) reconstruction structure by utilizing the adsorbed hydrocarbon molecules, the act of radiating electrons toward the surface of the silicon substrate is at an advantage in being readily effected because it constitutes a means of growth utilizing an environment of high vacuum.

The intermediate layer composed of the Group III nitride semiconductor disposed as bonded to the surface of the 3C-SiC layer possessing the (3×3) reconsideration structure turns out to be a growth layer excelling in flatness of surface. Further, the Group III nitride semiconductor layer, for example, which is formed by using as an under layer the intermediate layer having a flat surface becomes excellent in flatness of surface by inheriting the flatness of the surface of the under layer. When the Group III nitride semiconductor layer so excelling in flatness or the growth layer formed by using as the under layer this semiconductor layer is utilized as an active layer, therefore, it is made possible to fabricate a semiconductor device that excels in optical or electrical performances.

When the intermediate layer composed of a hexagonal Group III nitride semiconductor having a flat surface and formed on the surface of the (3×3) reconstruction structure of 3C-SiC or the Group III nitride semiconductor layer of high purity having a flat surface and formed by using the intermediate layer as the under layer is utilized as an electron transporting layer (channel layer) or as an electron supply layer, it is made possible to form a flat hetero-junction interface preferentially functioning for high-speed transit and motion of two-dimensional electrons and render preferential the fabrication of a Group III nitride semiconductor FET of high mobility. To be specific, the MESFET provided with a flat junction interface capable of efficiently accumulating two-dimensional electrons of high mobility and enabled to generate a high-speed transportation can be stably fabricated in addition to the fact that the hexagonal Group III nitride semiconductor material is enabled to manifest a piezo effect.

When the intermediate layer composed of a hexagonal Group III nitride semiconductor of a flat surface formed on the surface of the (3×3) reconstruction structure of 3C-SiC or the Group III nitride semiconductor layer of high purity having a flat surface and formed by using as the under layer the intermediate layer is utilized, for example, as a barrier layer, such as a clad layer, or as a light-emitting layer for use in a light-emitting device, it is made possible to fabricate a light-emitting device, such as an LED of high luminance. Particularly, on the surface of 3C-SiC possessing a (3×3) reconstruction structure, the Group III nitride semiconductor layer possessing a unique orientation can be formed. The Group III nitride semiconductor layer possessing such a unique orientation is useful as a light-emitting layer intended to bring light emission of high luminance because the crystal grain boundaries arising from a difference in orientation are contained with a small density.

Example 1

Example 1 describes the present invention specifically with reference to the case of fabricating a Group III nitride semiconductor LED composed of a stacked structure provided with an intermediate layer formed of a hexagonal Group III nitride semiconductor disposed on a (111) silicon substrate having a (111) crystal face as the surface via a cubic silicon carbide layer having a nonstoichiometric composition.

Figure 2:
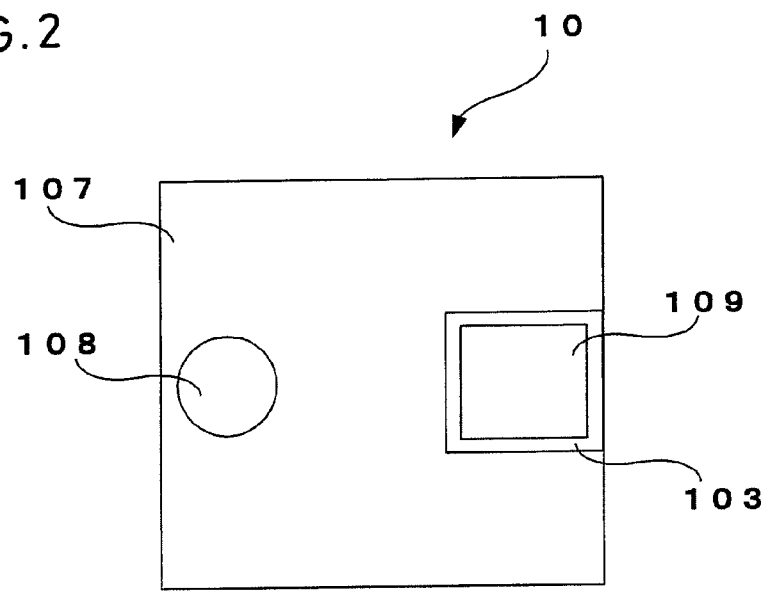
FIG. 2 is a schematic plan view illustrating the LED shown in FIG. 1.

The longitudinally sectioned structure of an LED 10 fabricated in Example 1 is schematically illustrated in FIG. 1. FIG. 2 schematically illustrates the plan-view structure of the LED 10 shown in FIG. 1.

For the fabrication of the LED 10, p-type silicon having a (111) crystal face as the surface thereof and having added boron (B) was used as a substrate 101. First, the substrate 101 was conveyed into a growth chamber for MBE growth and then heated to 850° C. in a high vacuum of approximately $5 \times 10^{-7}$ Pa. While the silicon substrate 101 was heated, electrons were simultaneously radiated toward the surface of the substrate 101. The electrons were radiated with a density of $1 \times 10^{12}$ cm$^{-2}$ at an acceleration voltage of 100 V. While the RHEED pattern was continuously monitored, the radiation of electrons was continued at the same temperature till (7×7) reconstruction structure appeared on the (111) crystal face constituting the surface of the substrate 101.

After the appearance of the (7×7) reconstruction structure was confirmed on the RHEED pattern, the substrate 101 laceed in the MBE growth chamber was cooled to 600° C. Then, in concert with the radiation of electrons toward the surface of the substrate 101, acetylene gas was blown onto the surface to induce adsorption of acetylene molecules on the surface. The electrons were radiated with a density of $1 \times 10^{13}$ cm$^{-2}$ at an acceleration voltage of 300 V. The blowing of acetylene gas was continued till the electron diffraction spots resulting from the (7×7) reconstruction structure of the surface of the substrate 101 became almost extinct on the RHEED pattern. At the time that the (7×7) reconstruction structure disappeared, the blowing of acetylene gas in the high vacuum was completed and the radiation of electrons toward the silicon substrate 101 was stopped as well.

After the blowing of acetylene gas and the radiation of electrons toward the surface of the substrate 101 were stopped, the substrate 101 was heated to 700° C. The radiation of electrons toward the surface of the silicon substrate 101 which had adsorbed acetylene molecules was started anew. The electrons were radiated with a density of $5 \times 10^{13}$ cm$^{-2}$ at an acceleration voltage of 350 V. The silicon substrate 101 was kept at 700° C. and the radiation of electrons was continued till streaks appeared on the RHEED pattern as an indication that the reaction of the adsorbed acetylene molecules and the silicon (Si) atoms in the neighborhood of the surface of the silicon substrate 101 resulted in forming a cubic 3C-type silicon carbide (3C-SiC) layer 102.

Based on the lattice constant of the (111) silicon at the temperature of forming the 3C-SiC layer 102 on the surface of the silicon substrate 101, the lattice constant of the 3C-SiC layer 102 was found by calculation to be 0.450 nm. This lattice constant of the 3C-SiC layer was judged to be ascribable not to the distortion under the influence of the silicon substrate 101 but to the stoichiometrically copious inclusion of silicon. Further, the surface was formed of a (111) crystal face. Moreover, the appearance of a (3×3) reconstruction structure on this surface was confirmed by observing the RHEED pattern.

Even when the position of incidence of an electron beam injected through the surface of the 3C-SiC layer 102 for the purpose of obtaining the RHEED pattern was varied, the RHEED pattern indicating the formation of the (3×3) reconstruction structure was uniformly acquired from the surface of the 3C-SiC layer 102. This fact indicated that the act of forming the 3C-SiC layer by simultaneously continuing radiation of electrons could produce an enhanced effect in forming the (3×3) reconstruction structure uniformly throughout the whole surface of the silicon substrate 101. The 3C-SiC layer 102 had a thickness of about 2 nm on approximately the whole surface of the silicon substrate 101.

On the (3×3) reconstruction structure-containing surface of the 3C-SiC layer 102 of a nonstoichiometric composition containing silicon copiously, a wurtzite crystal hexagonal aluminum-gallium nitride mixed crystal ($Al_{0.75}Ga_{0.25}N$) layer 103 was formed as an intermediate layer composed of a Group III nitrogen semiconductor by the high-frequency plasma MBE method using nitrogen plasma as a nitrogen source. The $Al_{0.75}Ga_{0.25}N$ layer 103 was formed, with the temperature of the silicon substrate 101 set at 720° C.

In the case of forming the $Al_{0.75}Ga_{0.25}N$ layer 103, the (3×3) reconstruction structure-containing surface of the reconstruction structure of the 3C-SiC layer 102 was irradiated with a beam of aluminum (Al) temporally prior to the nitrogen source mentioned above. The nitrogen source began to radiate the surface of the (3×3) reconstruction structure after the elapse of 5 seconds following the start of the radiation of the beam of aluminum.

The n-type $Al_{0.75}Ga_{0.25}N$ layer 103 had a thickness of approximately 50 nm and had a {0001} crystal face as the surface thereof Further, the $Al_{0.75}Ga_{0.25}N$ layer 103 turned out to be a layer particularly excelling in orientation because it was formed on the 3C-SiC layer 102 of a uniformly formed (3×3) reconstruction structure as the under layer. The relation of orientation determined based on the electron diffraction pattern was <110>-3C-SiC||<1.-2.1.0.>(a-axis)-$Al_{0.75}Ga_{0.25}N$. The observation of the surface by the use of an ordinary Atomic Force Microscope (AFM) revealed that the $Al_{0.75}Ga_{0.25}N$ layer 103 excelled in flatness as evinced by the fact that the vertical deviation of the surface thereof was approximately 1 nm at the maximum.

On the hexagonal wurtzite crystal $Al_{0.75}Ga_{0.25}N$ layer 103, a hexagonal n-type gallium nitride (GaN) layer 104 was formed at 720° C. by the same high-frequency plasma MBE method as used above. The n-type GaN layer 104 was produced in a thickness of approximately 3200 nm. In the case of growing the n-type GaN layer 104, a beam of gallium (Ga) and a nitrogen source were radiated simultaneously toward the surface of the $Al_{0.75}Ga_{0.25}N$ layer 103.

The n-type GaN layer 104 turned out to be a single crystal layer that excelled in uniformity of orientation and in crystallinity because it was formed on the $Al_{0.75}Ga_{0.25}N$ layer 103 of unique orientation used as the under layer. This GaN layer 104, therefore, was utilized as a lower clad layer.

On the lower clad layer 104, a light-emitting layer 105 of a five-cycle Multiple Quantum Well (MQW) structure produced by stacking alternately a barrier layer formed of an n-type GaN and a well layer formed of an n-type gallium-indium-nitride mixed crystal ($Ga_{0.85}In_{0.15}N$) in accordance with the same high-frequency plasma MBE method as used above. On the light-emitting layer 105, an upper clad layer 106 formed of a p-type $Al_{0.10}Ga_{0.90}N$ (thickness: about 45 nm) was disposed. Consequently, a light-emitting part of a p-n junction Double Hetero (DH) bonding structure consisting of the n-type clad layer 104, the n-type light-emitting layer 105 and the p-type upper clad layer 106 was produced. A stacked structure 100 intended for use in the LED 10 was produced by disposing a contact layer 107 formed of a p-type GaN (thickness: about 90 nm) on the p-type clad layer 106 partaking in the light-emitting part.

On the surface of the p-type contact layer 107 constituting the uppermost surface layer of the stacked structure 100, a p-type ohmic electrode 108 formed of gold (Au) and a nickel (Ni) oxide was disposed. An opposite n-type ohmic electrode 109 was disposed on the surface of the n-type $Al_{0.75}Ga_{0.25}N$ layer 103 exposed by removing the lower clad layer 104, light-emitting layer 105, upper clad layer 106 and contact layer 107 existing in the region destined to form the electrode 109 by an ordinary dry etching method. The n-type ohmic electrode 109 was composed of a titanium (Ti) film formed by an ordinary electron beam deposition method.

The LED chip 10 fabricated as described above was tested for optical and electrical performances by causing a device-operating current to flow between the p-type and n-type ohmic electrodes 108 and 109. When the current flowed in the forward direction to the LED 10, a blue light having a main wavelength of 460 nm was emitted. When the forward current was set at 20 mA, the emission output reached a high magnitude, such as about 2.3 mW. When the current of 20 mA flowed in the forward direction, the forward voltage (Vf) was about 3.6 V.

Since the light-emitting part could be formed of the Group III nitride semiconductor layer excelling in crystallinity on the (3×3) reconstruction structure surface of the 3C-SiC layer 102 of a nonstoichiometric composition containing silicon (Si) copiously as compared with carbon (C) via the intermediate layer formed of the Group III nitride semiconductor possessing unique orientation and excelling in crystallinity, the reverse voltage was 15 V when the reverse current was set at 10 μA. Then, the LED revealing virtually no local breakdown and excelling in reverse breakdown voltage could be realized.

Example 2

Example 2 describes the present invention specifically with reference to the case of fabricating a Group III nitride semiconductor MESFET composed of a stacked structure provided with an intermediate layer formed of a hexagonal Group III nitride semiconductor disposed on a (111) silicon substrate having a (111) crystal face as the surface thereof via a cubic silicon carbide layer having a nonstoichiometric composition.

Figure 3:
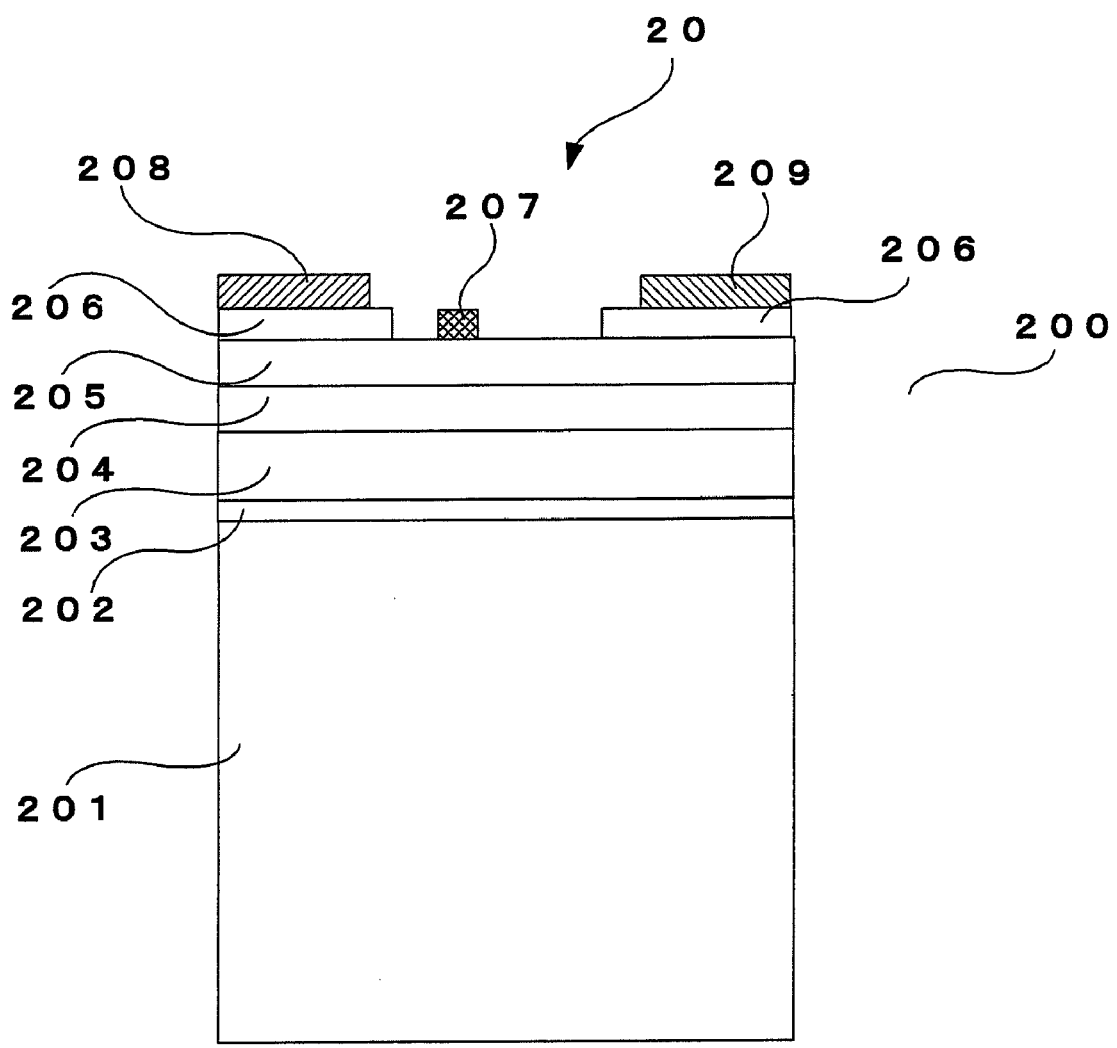
FIG. 3 is a schematic, longitudinally sectioned view illustrating the MESFET described in Example 2 of this invention.

The longitudinally sectioned diagram of an MESFET 20 fabricated in Example 2 is schematically illustrated in FIG. 3.

For the fabrication of the MESFET 20, a high-resistive silicon having a (111) crystal face as the surface thereof and having added phosphorus (P) was used as a substrate 201. The silicon substrate 201 was conveyed into a growth chamber for the MBE growth and then heated to 800° C. in a high vacuum of approximately $5×10^{-7}$ Pa. While the RHEED pattern was continuously monitored, the heating of electrons was continued at the same temperature till the (7×7) reconstruction structure appeared on the (111) crystal face constituting the surface of the silicon substrate 201.

After the appearance of the (7×7) reconstruction structure was confirmed, the silicon substrate 201 continuously placed in the MBE growth chamber was cooled to 400° C. Then, acetylene gas was brown onto the surface of the silicon substrate 201 to induce adsorption of acetylene molecules to the surface. The acetylene gas was continuously supplied till the electron diffraction spots originating in the (7×7) reconstruction structure of the surface of the substrate 201 became almost distinct on the RHEED pattern.

Thereafter, the silicon substrate 201 was heated to 500° C. At the time that the temperature of the substrate 201 was stabilized at 500° C., the radiation of electrons toward the surface of the silicon substrate 201 was started. The electrons were generated by an electrically heated tungsten (W) filament disposed inside a growth chamber in a high vacuum. The radiation of electrons was effected at an acceleration voltage of 500 V and with a radiation density of $5×10^{13}$ $cm^{-2}$. The radiation of electrons toward the surface of the substrate 201 was continued till streaks resulting from the (3×3) reconstruction structure of 3C-SiC appeared on the RHEED pattern.

Based on the lattice constant of silicon determined from the RHEED pattern of (111) silicon at 500° C., the lattice constant of the formed 3C-SiC layer 202 was calculated. By the calculation, the lattice constant of the 3C-SiC layer 202 was found to be 0.438 nm. This lattice constant is smaller than that of the 3C-SiC layer 102 described in Example 1. This lower lattice constant may be explained by taking into consideration the fact that the temperature for heating the silicon substrate after the adsorption of acetylene molecules in his case was lower than in the case of Example 1. Further, the RHEED pattern of the 3C-SiC layer 202 showed no discernible sign of extra diffraction due to twin crystals and stacking faults. The 3C-SiC layer 202 had a thickness of about 2 nm.

On the 3C-SiC layer 202 of a nonstoichiometric composition containing silicon copiously as compared with carbon, a hexagonal wurtzite crystal aluminum nitride (AlN) layer 203 was formed as an intermediate layer by the MBE method using nitrogen plasma as a nitrogen source. The undoped AlN layer 203 constituting the intermediate layer was formed, with the temperature of the silicon substrate 201 kept at 780° C. and the pressure inside the MBE growth chamber kept at a high vacuum of about $1×10^{-6}$ Pa. The nitrogen plasma was generated by means of Electron Cyclotron Resonance (ECR) procedure capable of applying a high frequency of 13.56 MHz and a magnetic field to nitrogen gas of high purity.

During the growth of the AlN layer 203 constituting the intermediate layer, the beam of aluminum (Al) was supplied earlier temporally to the surface of the (3×3) reconstruction structure of the 3C-SiC layer 202. The radiation of the nitrogen plasma toward the surface of the 3C-SiC layer 202 was started after the elapse of 3 seconds following the start of the radiation of the beam of aluminum.

The AlN layer 203 turned out to be a single crystal layer possessing a unique orientation because it was disposed as bonded to the surface of the 3C-SiC layer 202 possessing the (3×3) reconstruction structure. The relation of orientation determined from the electron diffraction pattern was found to be <110>-3C-SiC∥<1.-2.1.0.>(a-axis)-AlN. The AlN layer 203 was a high-resistive layer and had a thickness of about 8 nm. The observation of the surface by the use of an ordinary atomic force microscope revealed that the AlN layer 203 excelled in flatness as evinced by the fact that the maximum height difference of the surface thereof was about 1 nm at most.

On the {0 0.0.1.} crystal face of the surface of the AlN layer 203, an undoped n-type gallium nitride (GaN) layer was formed as an electron transporting layer 204 at 750° C. by the same MBE method as used above. The n-type GaN layer 204 constituting the electron transporting layer had a carrier concentration of $1×10^{17}$ $cm^{-3}$ and a thickness of about 25 nm. On the electron transporting layer 204, an electron supply layer 205 formed of an n-type hexagonal $Al_{0.25}Ga_{0.75}N$ mixed crystal having a carrier concentration of $1\times10^{18}$ cm$^{-3}$ and a thickness of about 25 nm was disposed. On the electron supply layer 205, a contact layer 206 formed of a hexagonal n-type GaN having a carrier concentration of $3\times10^{18}$ cm$^{-3}$ and a thickness of about 50 nm was disposed. Consequently, the stacked structure 200 for use in the MESFET 20 was completed.

The n-type GaN layer constituting the electron transporting layer 204 turned out to be a layer excelling in flatness of surface because it was disposed via the intermediate layer (AlN layer 203) formed of a Group III nitride semiconductor on the surface of the 3C-SiC layer 202 possessing a (3×3) reconstruction structure. The fact that it consequently formed a hetero junction possessing a flat junction interface with the electron supply layer 205 was confirmed by the observation of a lattice image obtained by means of a High-Resolution Transmission Electron Microscope (HRTEM).

Further, since the electron transporting layer 204 and the electron supply layer 205 together formed the hetero junction interface excelling in flatness, the stacked structure 200 configured by this invention revealed microscopically a high Hall mobility of about 1500 cm$^2$/V·s at room temperature. The MESFET 20 capable of realizing a high transconductance ($g_m$) by virtue of this high electron mobility was fabricated.

In preparation for the fabrication of the MESFET 20, the region for disposing a Schottky gate 207 and part of the contact layer 206 existing in the neighborhood of the region were removed by an ordinary dry etching technique. Then, on the surface of the electron supply layer 205 exposed in the recess region formed by the etching, a metallic gate e207 was formed. By supplying the remaining surfaces of the contact layer 206 opposed across the recess region with a source electrode 208 and a drain electrode 209, the MESFET 20 capable of realizing a high $g_m$ was completed.

Further, since the MESFET 20 was configured by having disposed as the under layer for the electron transporting layer 204 the Group III nitride semiconductor layer (high-resistive AlN layer) 203 excelling in both orientation and crystallinity as bonded to the 3C-SiC layer 202 of the (3×3) reconstruction structure, it was enabled to excel in the pinch off property of the source-drain current (the so-called Ids).

The invention claimed is:

1. A semiconductor device comprising:
    a substrate formed of a single crystal;
    a silicon carbide layer disposed on a surface of the single crystal substrate; and
    an intermediate layer disposed on a surface of the silicon carbide layer and formed of a single crystal Group III nitride semiconductor,
    wherein the silicon carbide layer is formed of a cubic crystal non-stoichiometrically containing silicon copiously and the surface thereof has a (3×3) reconstruction structure, and has a lattice constant that is more than 0.436 nm and is less than or equal to 0.460 nm.

2. A semiconductor device according to claim 1, wherein the substrate is formed of a silicon single crystal.

3. A semiconductor device according to claim 1, wherein the substrate is formed of a {111} silicon single crystal possessing a {111} crystal face as the surface thereof.

4. A semiconductor device according to claim 3, wherein the surface of the substrate has a (7×7) reconstruction structure.

5. A semiconductor device according to claim 1, wherein the intermediate layer contains aluminum as a Group III element.

6. A semiconductor device according to claim 5, wherein the intermediate layer is formed of hexagonal wurtzite crystal aluminum-gallium nitride ($Al_xGa_{1-x}N$ wherein $0 \leq x \leq 1$).

7. A semiconductor according to claim 1, wherein the intermediate layer has a Group III nitride semiconductor layer disposed thereon.

8. A method for producing a semiconductor device, said semiconductor device comprising a substrate formed of a single crystal, a silicon carbide layer disposed on a surface of the single crystal substrate and an intermediate layer disposed on a surface of the silicon carbide layer and formed of a single crystal Group III nitride semiconductor, wherein the silicon carbide layer is formed of a cubic crystal non-stoichiometrically containing silicon copiously and the surface thereof has a (3×3) reconstruction structure, and has a lattice constant that is more than 0.436 nm and is less than or equal to 0.460 nm, said method comprising:
    a first step of blowing a hydrocarbon gas on the surface of the substrate, thereby inducing adsorption of hydrocarbon thereon;
    a second step of heating the substrate having adsorbed the hydrocarbon to a temperature exceeding a temperature used for the adsorption of the hydrocarbon while irradiating the surface of the substrate with electrons and consequently giving rise to a silicon carbide layer formed of a cubic crystal stoichiometrically containing silicon copiously and provided with a surface having a (3×3) reconstruction structure; and
    a third step of supplying a gaseous raw material containing nitrogen and a gaseous raw material containing a Group III element to the surface of the silicon carbide layer and consequently giving rise to the intermediate layer formed of the Group III nitride semiconductor.

9. A method according to claim 8, wherein the intermediate layer is formed in the third step by supplying the gaseous raw material containing the Group III element temporally prior to the gaseous raw material containing nitrogen.

10. A method according to claim 8, wherein the intermediate layer formed of a Group III nitrogen semiconductor layer containing aluminum is formed in the third step by supplying a gaseous raw material containing aluminum temporally first, then supplying the gaseous raw material containing the Group III element other than aluminum, and subsequently supplying the gaseous raw material containing nitrogen.

11. A method according to claim 8, wherein the adsorption of hydrocarbon to the surface of the substrate in the first step is implemented by blowing the hydrocarbon gas on the surface of the substrate and irradiating the surface with electrons meanwhile.

* * * * *